(12) United States Patent
Kim (10) Patent No.: US 11,146,272 B2
(45) Date of Patent: Oct. 12, 2021

(54) COMPARATOR

(71) Applicant: SK hynix Inc., Icheon-si (KR)

(72) Inventor: Chang Hyun Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/904,310

(22) Filed: Jun. 17, 2020

(65) Prior Publication Data

US 2021/0226634 A1 Jul. 22, 2021

(30) Foreign Application Priority Data

Jan. 21, 2020 (KR) ........................ 10-2020-0007895

(51) Int. Cl.
*G06F 7/00* (2006.01)
*G06F 7/02* (2006.01)
*G06F 7/22* (2006.01)
*G06F 11/00* (2006.01)
*H03K 19/17792* (2020.01)
*H03K 19/20* (2006.01)

(52) U.S. Cl.
CPC ....... *H03K 19/17792* (2013.01); *H03K 19/20* (2013.01)

(58) Field of Classification Search
None
See application file for complete search history.

(56) References Cited

U.S. PATENT DOCUMENTS

| 5,130,578 | A | * | 7/1992 | Stone ........................ G06F 7/02 327/99 |
| 8,234,320 | B1 | * | 7/2012 | Yeo .................... H03M 13/1122 708/207 |
| 10,110,215 | B2 | * | 10/2018 | Shimauchi .......... H03F 3/45071 |
| 10,454,488 | B1 | * | 10/2019 | Monangi ............. H03M 1/1014 |
| 2019/0155680 | A1 | | 5/2019 | Yamate et al. |

FOREIGN PATENT DOCUMENTS

KR 101561344 B1 10/2015

* cited by examiner

*Primary Examiner* — Kenneth B Wells
(74) *Attorney, Agent, or Firm* — William Park & Associates Ltd.

(57) ABSTRACT

A semiconductor device includes a selection signal generation circuit configured to generate a selection signal by comparing a first input signal and a second input signal. The semiconductor device also includes a comparison signal generation circuit configured to output a comparison signal by selecting one of the first input signal and the second input signal based on the selection signal.

19 Claims, 8 Drawing Sheets

COMPARATOR

CROSS-REFERENCE TO RELATED APPLICATION

The present application claims priority under 35 U.S.C. § 119(a) to Korean Patent Application No. 10-2020-0007895, filed on Jan. 21, 2020, in the Korean Intellectual Property Office, the disclosure of which is incorporated herein by reference in its entirety.

BACKGROUND

1. Technical Field

Embodiments of the disclosure may generally relate to a comparator which operates at a high speed.

2. Related Art

An electronic device including a semiconductor device may perform various internal operations. Whether to perform the internal operations may be determined through a comparator which compares the magnitudes of signals. As the operation of the comparator becomes faster, the speed of the internal operations is improved, which may help the high speed operation of the electronic device.

SUMMARY

In an embodiment, a semiconductor device may include a selection signal generation circuit configured to generate a selection signal by comparing a first input signal and a second input signal. The semiconductor device may also include a comparison signal generation circuit configured to output a comparison signal by selecting one of the first input signal and the second input signal based on the selection signal.

In an embodiment, a semiconductor device may include a selection signal generation circuit configured to generate an $(N-1)^{\wedge}$th bit of a selection signal which has a first logic level, when an $N^{\wedge}$th bit of a first input signal is different from an $N^{\wedge}$th bit of a second input signal. The semiconductor device may also include a comparison signal generation circuit configured to output the $N^{\wedge}$th bit of the first input signal as a comparison signal when the $(N-1)^{\wedge}$th bit of the selection signal has the first logic level, wherein N is a natural number of 2 or more.

In an embodiment, a semiconductor device may include a selection signal generation circuit configured to generate an $(N-1)^{\wedge}$th bit of a selection signal which has a first logic level, when an $N^{\wedge}$th bit of a first input signal is different from an $N^{\wedge}$th bit of a second input signal. The semiconductor device may also include a comparison signal generation circuit configured to output a comparison signal by inverting and buffering the $N^{\wedge}$th bit of the second input signal when the $(N-1)^{\wedge}$th bit of the selection signal has the first logic level, wherein N is a natural number of 2 or more.

DETAILED DESCRIPTION

The term "preset" means that the numerical value of a parameter is predetermined when the parameter is used in a process or algorithm. Depending on an embodiment, the numerical value of a parameter may be set when a process or algorithm starts or may be set during a period during which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the one component may be coupled or connected the other component either directly or through an intermediary component. On the other hand, the descriptions of "directly coupled" and "directly connected" should be understood to mean that the one component is coupled and connected to the other component directly without the intervention of another component.

"Logic high level" and "logic low level" are used to describe logic levels of signals. A signal having a "logic high level" is distinguished from a signal having a "logic low level." For example, when a signal having a first voltage corresponds to a "logic high level," a signal having a second voltage may correspond to a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, various examples of embodiments of the disclosure will be described in detail with reference to the accompanying drawings. These embodiments are only for illustrating the disclosure, and the scope of protection of the disclosure is not limited by these embodiments.

Various embodiments of the present disclosure are directed to a comparator which operates at a high speed. According to some embodiments, through selecting one bit among bits included in input signals, based on selection signals generated by comparing the respective bits included in the input signals, and generating a comparison signal by the selected bit of an input signal, the area and current consumption of a circuit which performs the operation of comparing the input signals may be reduced.

Figure 1:
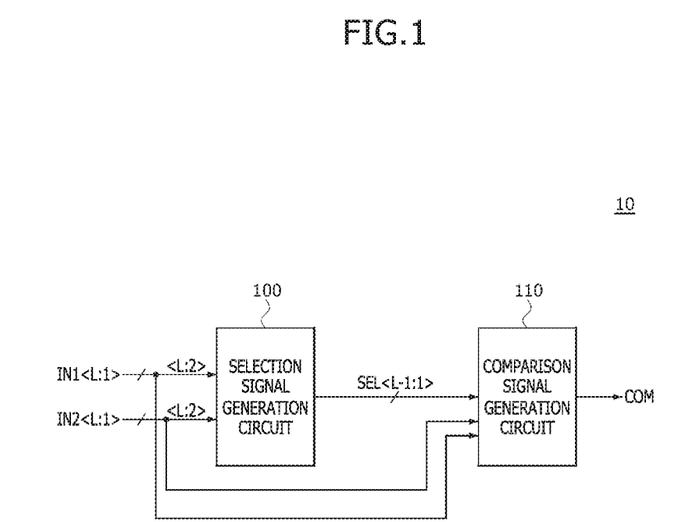
FIG. 1 is a block diagram illustrating a configuration of a comparator in accordance with an embodiment of the disclosure.

FIG. 1 is a block diagram illustrating a comparator 10 in accordance with an embodiment of the present disclosure.

As illustrated in FIG. 1, the comparator 10 may include a selection signal generation circuit 100 and a comparison signal generation circuit 110.

The selection signal generation circuit 100 may generate a selection signal SEL<L−1:1> based on a first input signal IN1<L:2> and a second input signal IN2<L:2>, The selection signal generation circuit 100 may compare a second bit IN1<2> of the first input signal and a second bit IN2<2> of the second input signal, and thereby, may generate a first bit SEL<1> of the selection signal which has a preset logic level determined depending on a comparison result. The selection signal generation circuit 100 may generate the first bit SEL<1> of the selection signal which has a first logic level, when the second bit IN1<2> of the first input signal is different from the second bit IN2<2> of the second input signal, and may generate the first bit SEL<1> of the selection signal which has a second logic level, when the second bit IN1<2> of the first input signal is the same as the second bit IN2<2> of the second input signal. In the present embodiment, the first logic level may be set to a logic low level and the second logic level may be set to a logic high level, but it is to be noted that the embodiment is not limited thereto. The selection signal generation circuit 100 may compare an L^th bit IN1<L> of the first input signal and an L^th bit IN2<L> of the second input signal, and thereby, may generate an (L−1)^th bit SEL<L−1> of the selection signal which has a preset logic level determined depending on a comparison result. In the present embodiment, the selection signal generation circuit 100 generates the selection signal SEL<L−1:1> by using the first input signal IN1<L:2> and the second input signal IN2<L:2>, but bits of input signals, which are used to generate the selection signal SEL<L−1:1>, are not limited thereto.

The comparison signal generation circuit 110 may generate a comparison signal COM from the first input signal IN1<L:1> or the second input signal IN2<L:1> based on the selection signal SEL<L−1:1>. When the (L−1)^th bit SEL<L−1> of the selection signal which has the first logic level is inputted, the comparison signal generation circuit 110 may output the L^th bit IN1<L> of the first input signal as the comparison signal COM or output the comparison signal COM by inverting and buffering the L^th bit IN2<L> of the second input signal. When the (L−1)^th bit SEL<L−1> of the selection signal which has the second logic level is inputted and an (L−2)^th bit SEL<L−2> of the selection signal which has the first logic level is inputted, the comparison signal generation circuit 110 may output an (L−1)^th bit IN1<L−1> of the first input signal as the comparison signal COM or output the comparison signal COM by inverting and buffering an (L−1)^th bit IN2<L−1> of the second input signal. When (L−1)^th and (L−2)^th bits SEL<L−1:L−2> of the selection signal which have the second logic level are inputted and an (L−3)^th bit SEL<L−3> of the selection signal which has the first logic level is inputted, the comparison signal generation circuit 110 may output an (L−2)^th bit IN1<L−2> of the first input signal as the comparison signal COM or output the comparison signal COM by inverting and buffering an (L−2)^th bit IN2<L−2> of the second input signal. When (L−1)^th to second bits SEL<L−1:2> of the selection signal which have the second logic level are inputted and the first bit SEL<1> of the selection signal which has the first logic level is inputted, the comparison signal generation circuit 110 may output the second bit IN1<2> of the first input signal as the comparison signal COM or output the comparison signal COM by inverting and buffering the second bit IN2<2> of the second input signal. When the (L−1)^th to first bits SEL<L−1:1> of the selection signal which have the second logic level are inputted, the comparison signal generation circuit 110 may output the comparison signal COM by buffering a first bit IN1<1> of the first input signal or output the comparison signal COM by inverting and buffering a first bit IN2<1> of the second input signal. A logic level of the comparison signal COM may include information on a comparison result of the first input signal IN1<L:1> and the second input signal IN2<L:1>. For example, when the comparison signal COM has the first logic level, it may mean that the first input signal IN1<L:1> is set to be equal to or smaller than the second input signal IN2<L:1>, and when the comparison signal COM has the second logic level, it may mean that the first input signal IN1<L:1> is set to be larger than the second input signal IN2<L:1>. In the present embodiment, the first logic level may be set to a logic low level and the second logic level may be set to a logic high level, but it is to be noted that the embodiment is not limited thereto.

Figure 2:
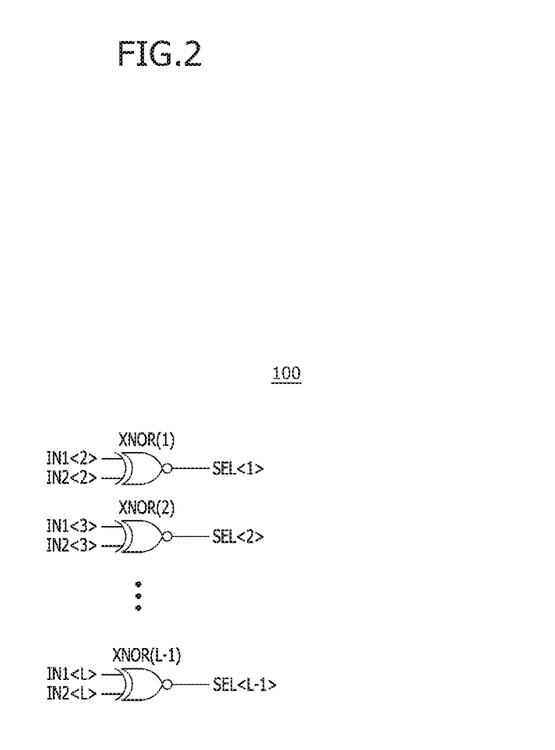
FIG. 2 is a circuit diagram illustrating a selection signal generation circuit included in the comparator illustrated in FIG. 1.

FIG. 2 is a circuit diagram illustrating the selection signal generation circuit 100 included in the comparator 10. As illustrated in FIG. 2, the selection signal generation circuit 100 may include first to (L−1)^th XNOR gates XNOR(1: L−1). The first XNOR gate XNOR(1) may receive the second bit IN1<2> of the first input signal and the second bit IN2<2> of the second input signal, perform an XNOR logic operation, and generate the first bit SEL<1> of the selection signal. The first XNOR gate XNOR(1) may generate the first bit SEL<1> of the selection signal which has a logic low level, when the second bit IN1<2> of the first input signal and the second bit IN2<2> of the second input signal have different logic levels. The first XNOR gate XNOR(1) may generate the first bit SEL<1> of the selection signal which has a logic high level, when the second bit IN1<2> of the first input signal and the second bit IN2<2> of the second input signal have the same logic level. The second XNOR gate XNOR(2) may receive a third bit IN1<3> of the first input signal and a third bit IN2<3> of the second input signal, perform an XNOR logic operation, and generate the second bit SEL<2> of the selection signal. The second XNOR gate XNOR(2) may generate the second bit SEL<2> of the selection signal which has a logic low level, when the third bit IN1<3> of the first input signal and the third bit IN2<3> of the second input signal have different logic levels. The second XNOR gate XNOR(2) may generate the second bit SEL<2> of the selection signal which has a logic high level, when the third bit IN1<3> of the first input signal and the third bit IN2<3> of the second input signal have the same logic level. The (L−1)^th XNOR gate XNOR(L−1) may receive the L^th bit IN1<L> of the first input signal and the L"th bit IN2<L> of the second input signal, perform an XNOR logic operation, and generate the (L−1)^th bit SEL<L−1> of the selection signal. The (L−1)^th XNOR gate XNOR(L−1) may generate the (L−1)^th bit SEL<L−1> of the selection signal which has a logic low level, when the L"th bit IN1<L> of the first input signal and the L^th bit IN2<L> of the second input signal have different logic levels. The (L−1)^th XNOR gate XNOR(L−1) may generate the (L−1)^th bit SEL<L−1> of the selection signal which has a logic high level, when the L^th bit IN1<L> of the first input signal and the L"th bit IN2<L> of the second input signal have the same logic level.

Figure 3:
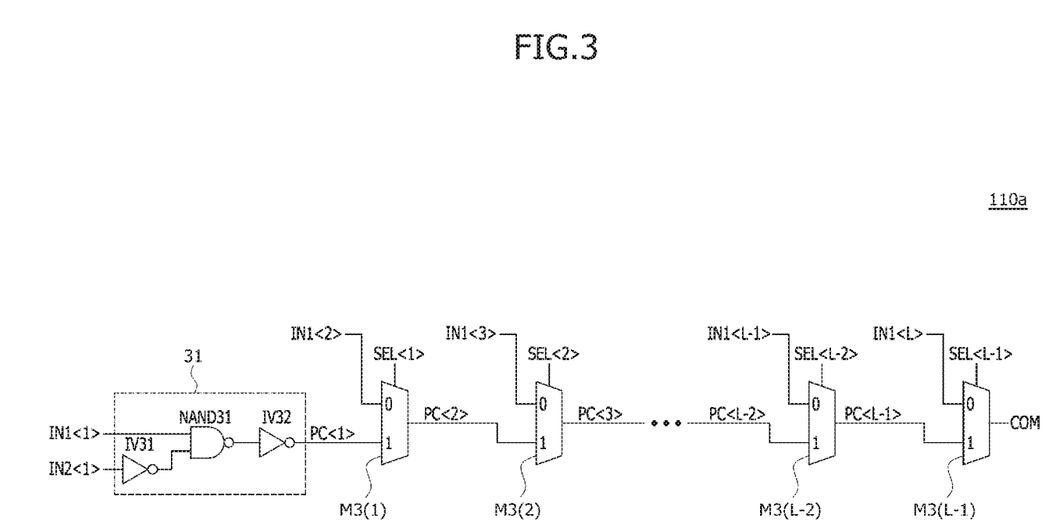
FIG. 3 is a circuit diagram illustrating a comparison signal generation circuit included in the comparator illustrated in FIG. 1.

FIG. 3 is a circuit diagram illustrating the comparison signal generation circuit 110 included in the comparator 10. As illustrated in FIG. 3, a comparison signal generation circuit 110a may include an input signal reception circuit 31 and first to (L−1)^th code selection circuits M3(L−1:1).

The input signal reception circuit 31 may include inverters IV31 and IV32 and a NAND gate NAND31 which are electrically coupled. The inverter IV31 may invert and buffer the first bit IN2<1> of the second input signal, and may output an output signal. The NAND gate NAND31 and the inverter IV32 may receive the first bit IN1<1> of the first input signal and the output signal of the inverter IV31, perform an AND logic operation, and generate a first pre-code PC<1>.

The first code selection circuit M3(1) may output a second pre-code PC<2> by selecting the second bit IN1<2> of the first input signal or the first pre-code PC<1> based on the first bit SEL<1> of the selection signal. The first code selection circuit M3(1) may output the second bit IN1<2> of the first input signal as the second pre-code PC<2> when the first bit SEL<1> of the selection signal has a logic low level. The first code selection circuit M3(1) may output the first pre-code PC<1> as the second pre-code PC<2> when the first bit SEL<1> of the selection signal has a logic high level.

The second code selection circuit M3(2) may output a third pre-code PC<3> by selecting the third bit IN1<3> of the first input signal or the second pre-code PC<2> based on the second bit SEL<2> of the selection signal. The second code selection circuit M3(2) may output the third bit IN1<3> of the first input signal as the third pre-code PC<3> when the second bit SEL<2> of the selection signal has a logic low level. The second code selection circuit M3(2) may output the second pre-code PC<2> as the third pre-code PC<3> when the second bit SEL<2> of the selection signal has a logic high level.

The (L−2)^th code selection circuit M3(L−2) may output an (L−1)^th pre-code PC<L−1> by selecting the (L−1)^th bit IN1<L−1> of the first input signal or an (L−2)^th pre-code PC<L−2> based on the (L−2)^th bit SEL<L−2> of the selection signal. The (L−2)^th code selection circuit M3(L−2) may output the (L−1)^th bit IN1<L−1> of the first input signal as the (L−1)^th pre-code PC<L−1> when the (L−2)^th bit SEL<L−2> of the selection signal has a logic low level. The (L−2)^th code selection circuit M3(L−2) may output the (L−2)"th pre-code PC<L−2> as the (L−1)^th pre-code PC<L−1> when the (L−2)^th bit SEL<L−2> of the selection signal has a logic high level.

The (L−1)^th code selection circuit M3(L−1) may output the comparison signal COM by selecting the L"th bit IN1<L> of the first input signal or the (L−1)^th pre-code PC<L−1> based on the (L−1)^th bit SEL<L−1> of the selection signal. The (L−1)^th code selection circuit M3(L−1) may output the L^th bit IN1<L> of the first input signal as the comparison signal COM when the (L−1)^th bit SEL<L−1> of the selection signal has a logic low level. The (L−1)^th code selection circuit M3(L−1) may output the (L−1)^th pre-code PC<L−1> as the comparison signal COM when the (L−1)^th bit SEL<L−1> of the selection signal has a logic high level.

Figure 4:
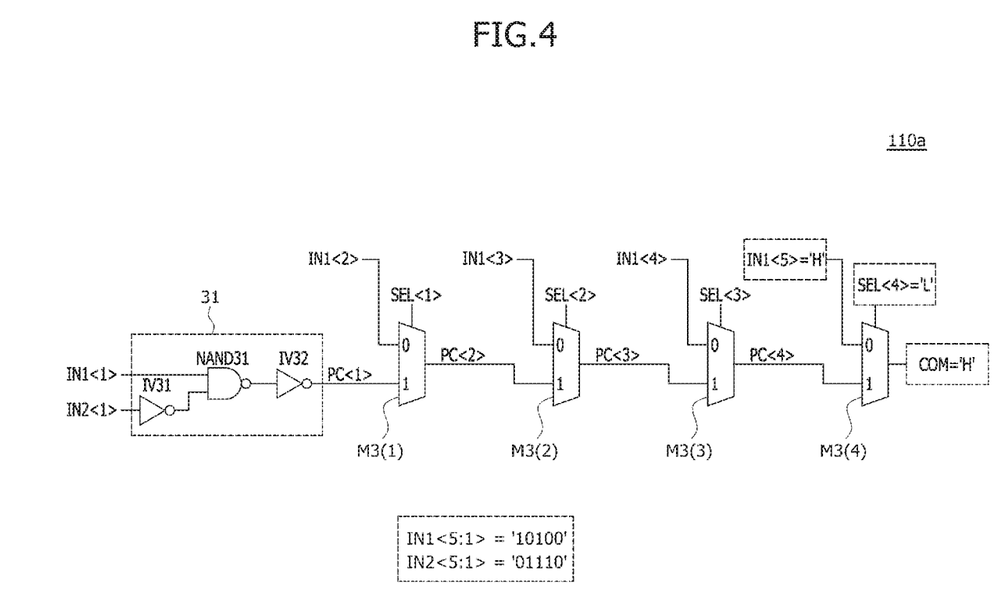
FIGS. 4 and 5 are circuit diagrams to assist in the explanation of the operation of the comparison signal generation circuit illustrated in FIG. 3.
Figure 5:
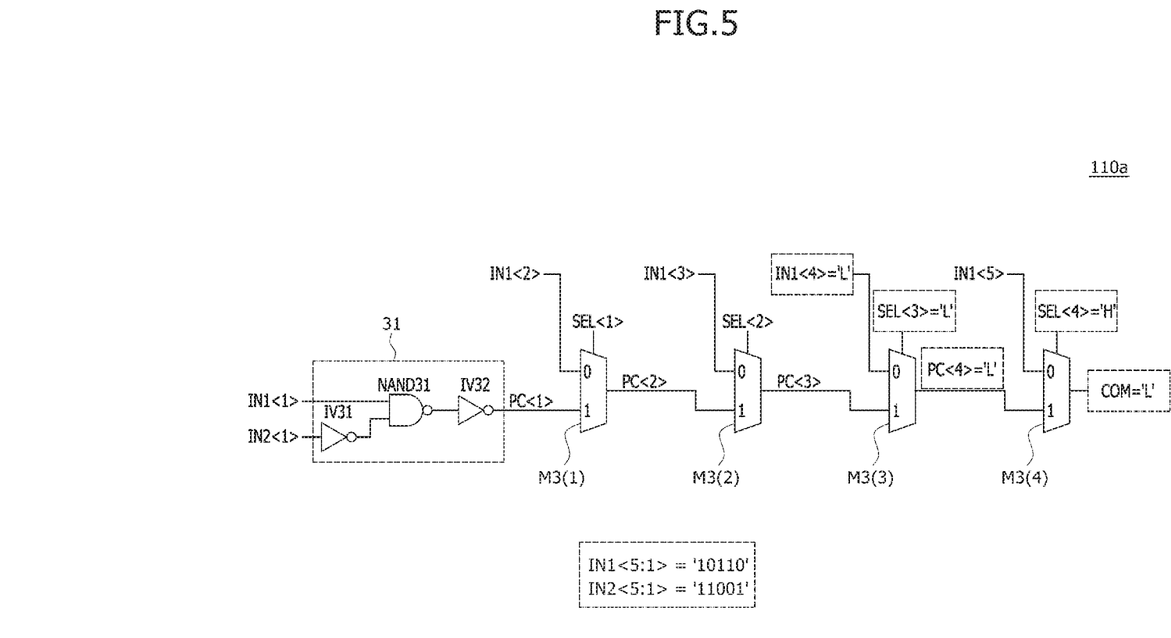

FIGS. 4 and 5 are circuit diagrams to assist in the explanation of the operation of the comparison signal generation circuit 110a.

As illustrated in FIG. 4, the operation of the comparison signal generation circuit 110a when a first input signal IN1<5:1> is a binary '10100' (a decimal number '20') and a second input signal IN2<5:1> is a binary '01110' (a decimal number '14') is as follows. Here, '0' may mean a logic low level, and '1' may mean a logic high level. Because a fifth bit IN1<5> of the first input signal and a fifth bit IN2<5> of the second input signal are different from each other, a fourth bit SEL<4> of a selection signal is generated at a logic low level, and the comparison signal COM is generated at a logic high level as a logic level of the fifth bit IN1<5> of the first input signal. It may be confirmed that, when the comparison signal COM is the logic high level, the first input signal IN1<5:1> is set to be larger than the second input signal IN2<5:1>. The comparison signal generation circuit 110a according to the present embodiment may generate the comparison signal COM from the fifth bit IN1<5> of the first input signal by using the fourth bit SEL<4> of the selection signal which is generated by comparing only most significant bits of the first input signal IN1<5:1> and the second input signal IN2<5:1>. Because the comparison signal generation circuit 110a according to the present embodiment is realized to be capable of performing a comparison operation based only on comparison of some bits included in the first input signal IN1<5:1> and the second input signal IN2<5:1>, an area and current consumption may be reduced or minimized.

As illustrated in FIG. 5, the operation of the comparison signal generation circuit 110a when a first input signal IN1<5:1> is a binary '10110' (a decimal number '22') and a second input signal IN2<5:1> is a binary '11001' (a decimal number '25') is as follows. Because a fifth bit IN1<5> of the first input signal and a fifth bit IN2<5> of the second input signal are the same as each other, a fourth bit SEL<4> of a selection signal is generated at a logic high level, and because a fourth bit IN1<4> of the first input signal and a fourth bit IN2<4> of the second input signal are different from each other, a third bit SEL<3> of the selection signal is generated at a logic low level. The comparison signal COM is generated at a logic low level as a logic level of the fourth bit IN1<4> of the first input signal by the third bit SEL<3> of the selection signal. It may be confirmed that, when the comparison signal COM has a logic low level, the first input signal IN1<5:1> is set to be equal to or smaller than the second input signal IN2<5:1>. The comparison signal generation circuit 110a according to the present embodiment may generate the comparison signal COM from the fourth bit IN1<4> of the first input signal by using the fourth and third bits SEL<4:3> of the selection signal which are generated by sequentially comparing most significant bits of the first input signal IN1<5:1> and the second input signal IN2<5:1>. Because the comparison signal generation circuit 110a according to the present embodiment is realized to be capable of performing a comparison operation based only on comparison of some bits included in the first input signal IN1<5:1> and the second input signal IN2<5:1>, an area and current consumption may be reduced or minimized.

Figure 6:
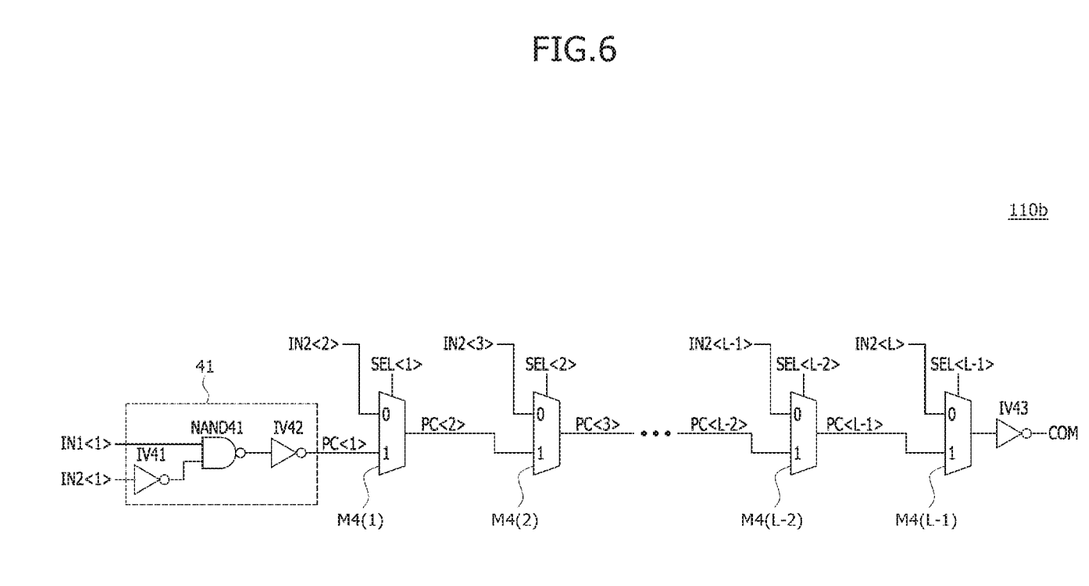
FIG. 6 is a circuit diagram illustrating another embodiment of the comparison signal generation circuit included in the comparator illustrated in FIG. 1.

FIG. 6 is a circuit diagram illustrating another embodiment of the comparison signal generation circuit 110 included in the comparator 10. As illustrated in FIG. 6, a comparison signal generation circuit 110b may include an input signal reception circuit 41, first to (L−1)^th code selection circuits M4(L−1:1), and an inverter IV43.

The input signal reception circuit 41 may include inverters IV41 and IV42 and a NAND gate NAND41 which are electrically coupled. The inverter IV41 may invert and buffer the first bit IN2<1> of the second input signal, and may output an output signal. The NAND gate NAND41 and the inverter IV42 may receive the first bit IN1<1> of the first input signal and the output signal of the inverter IV41, perform an AND logic operation, and generate a first pre-code PC<1>.

The first code selection circuit M4(1) may output a second pre-code PC<2> by selecting the second bit IN2<2> of the second input signal or the first pre-code PC<1> based on the first bit SEL<1> of the selection signal. The first code selection circuit M4(1) may output the second bit IN2<2> of the second input signal as the second pre-code PC<2> when the first bit SEL<1> of the selection signal has a logic low level. The first code selection circuit M4(1) may output the first pre-code PC<1> as the second pre-code PC<2> when the first bit SEL<1> of the selection signal has a logic high level.

The second code selection circuit M4(2) may output a third pre-code PC<3> by selecting the third bit IN2<3> of the second input signal or the second pre-code PC<2> based on the second bit SEL<2> of the selection signal. The second code selection circuit M4(2) may output the third bit IN2<3> of the second input signal as the third pre-code PC<3> when the second bit SEL<2> of the selection signal has a logic low level. The second code selection circuit M4(2) may output the second pre-code PC<2> as the third pre-code PC<3> when the second bit SEL<2> of the selection signal has a logic high level.

The (L−2)^th code selection circuit M4(L−2) may output an (L−1)^th pre-code PC<L−1> by selecting the (L−1)^th bit IN2<L−1> of the second input signal or an (L−2)^th pre-code PC<L−2> based on the (L−2)^th bit SEL<L−2> of the selection signal. The (L−2)^th code selection circuit M4(L−2) may output the (L−1)^th bit IN2<L−1> of the second input signal as the (L−1)^th pre-code PC<L−1> when the (L−2)^th bit SEL<L−2> of the selection signal has a logic low level. The (L−2)^th code selection circuit M4(L−2) may output the (L−2)^th pre-code PC<L−2> as the (L−1)^th pre-code PC<L−1> when the (L−2)^th bit SEL<L−2> of the selection signal has a logic high level.

The (L−1)^th code selection circuit M4(L−1) may output the comparison signal COM by selecting the L^th bit IN2<L> of the second input signal or the (L−1)^th pre-code PC<L−1> based on the (L−1)^th bit SEL<L−1> of the selection signal. The (L−1)^th code selection circuit M4(L−1) may select and output the L^th bit IN2<L> of the second input signal when the (L−1)^th bit SEL<L−1> of the selection signal has a logic low level. The (L−1)^th code selection circuit M4(L−1) may select and output the (L−1)^th pre-code PC<L−1> when the (L−1)^th bit SEL<L−1> of the selection signal has a logic high level. The inverter IV43 may output the comparison signal COM by inverting and buffering the output signal of the (L−1)^th code selection circuit M4(L−1).

Figure 7:
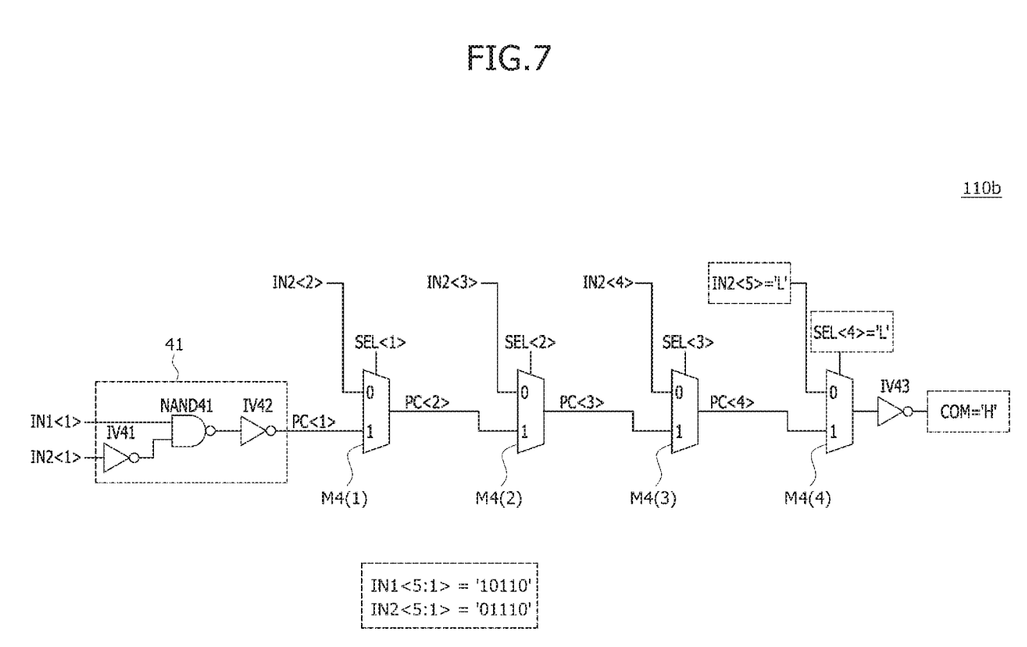
FIGS. 7 and 8 are circuit diagrams to assist in the explanation of the operation of the comparison signal generation circuit illustrated in FIG. 6.
Figure 8:
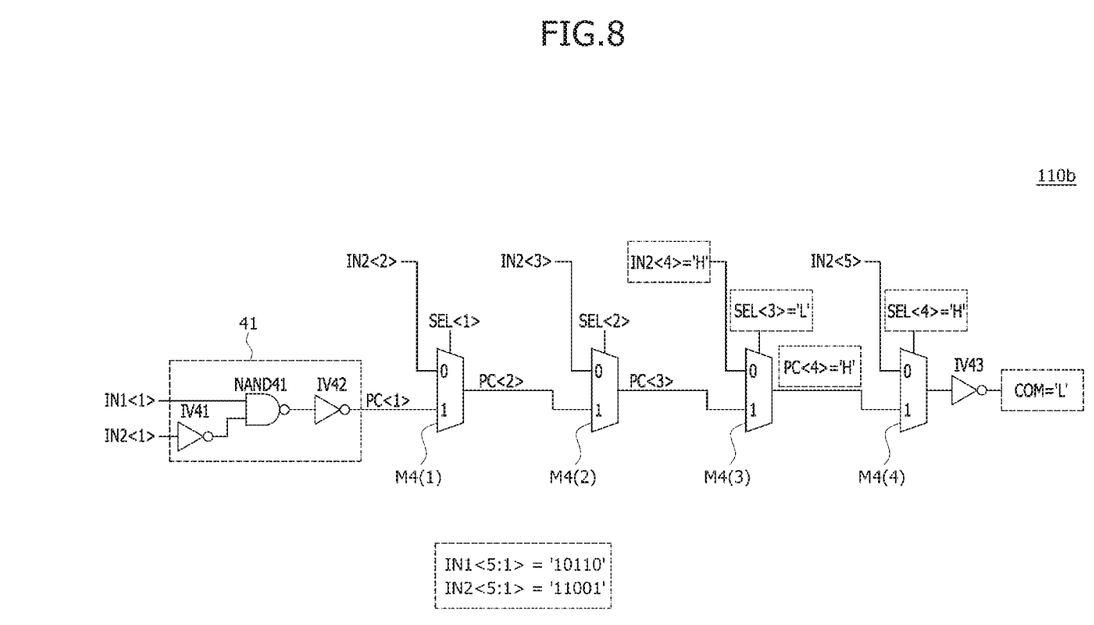

FIGS. 7 and 8 are circuit diagrams to assist in the explanation of the operation of the comparison signal generation circuit 110b.

As illustrated in FIG. 7, the operation of the comparison signal generation circuit 110b when a first input signal IN1<5:1> is a binary '10100' (a decimal number '20') and a second input signal IN2<5:1> is a binary '01110' (a decimal number '14') is as follows. Because a fifth bit IN1<5> of the first input signal and a fifth bit IN2<5> of the second input signal are different from each other, a fourth bit SEL<4> of a selection signal is generated at a logic low level, and the comparison signal COM is generated at a logic high level by inverting and buffering a logic level of the fifth bit IN2<5> of the second input signal. It may be confirmed that, when the comparison signal COM has a logic high level, the first input signal IN1<5:1> is set to be larger than the second input signal IN2<5:1>. The comparison signal generation circuit 110b according to the present embodiment may generate the comparison signal COM from the fifth bit IN2<5> of the second input signal by using the fourth bit SEL<4> of the selection signal which is generated by comparing only most significant bits of the first input signal IN1<5:1> and the second input signal IN2<5:1>. Because the comparison signal generation circuit 110b according to the present embodiment is realized to be capable of performing a comparison operation based only on comparison of some bits included in the first input signal IN1<5:1> and the second input signal IN2<5:1>, an area and current consumption may be reduced or minimized.

As illustrated in FIG. 8, the operation of the comparison signal generation circuit 110b when a first input signal IN1<5:1> is a binary '10110' (a decimal number '22') and a second input signal IN2<5:1> is a binary '11001' (a decimal number '25') is as follows. Because a fifth bit IN1<5> of the first input signal and a fifth bit IN2<5> of the second input signal are the same as each other, a fourth bit SEL<4> of a selection signal is generated at a logic high level, and because a fourth bit IN1<4> of the first input signal and a fourth bit IN2<4> of the second input signal are different from each other, a third bit SEL<3> of the selection signal is generated at a logic low level. The comparison signal COM is generated at a logic low level by inverting and buffering a logic level of the fourth bit IN2<4> of the second input signal by the third bit SEL<3> of the selection signal. It may be confirmed that, when the comparison signal COM has a logic low level, the first input signal IN1<5:1> is set to be equal to or smaller than the second input signal IN2<5:1>. The comparison signal generation circuit 110b according to the present embodiment may generate the comparison signal COM from the fourth bit IN2<4> of the second input signal by using the fourth and third bits SEL<4:3> of the selection signal which are generated by sequentially comparing most significant bits of the first input signal IN1<5:1> and the second input signal IN2<5:1>. Because the comparison signal generation circuit 110b according to the present embodiment is realized to be capable of performing a comparison operation based only on comparison of some bits included in the first input signal IN1<5:1> and the second input signal IN2<5:1>, an area and current consumption may be reduced or minimized.

While various embodiments have been described above, it will be understood by those skilled in the art that the described embodiments represent only a limited number of possible examples. Accordingly, the comparator described herein should not be limited to based on the described embodiments.

What is claimed is:
1. A semiconductor device comprising:
a selection signal generation circuit configured to generate a selection signal by comparing a first input signal and a second input signal; and
a comparison signal generation circuit configured to output a comparison signal by selecting one of the first input signal and the second input signal responsive to the selection signal, the comparison signal generation circuit comprising a plurality of serially-connected code selection circuits, each code selection circuit having: first and second input signal ports, a selection signal port and an output port from which the comparison signal is output responsive to a signal provided to the selection signal port;
wherein a logic level of the comparison signal output from each serially-connected code selection circuit is set responsive to a comparison of a first signal input to the first signal input port to a second input to the second signal input port;
wherein the comparison signal has a first logic level when the first signal input to the first signal input port is equal to or smaller than the second signal input to the second signal input port;

wherein the comparison signal has a second logic level when the first signal input to the first signal input port is greater than the second signal input to the second signal port; and, wherein each of the first input signal and the second input signal comprises more bits than the comparison signal.

2. The semiconductor device according to claim 1, wherein the selection signal generation circuit is configured to, when the first input signal includes first to N^th bits, the second input signal includes first to N^th bits, the selection signal includes first to (N−1)^th bits, and N is set to a natural number of 2 or more, generate the (N−1)^th bit of the selection signal by comparing the N^th bit of the first input signal and the N^th bit of the second input signal.

3. The semiconductor device according to claim 1, wherein the selection signal generation circuit is configured to, when the first input signal includes first to N^th bits, the second input signal includes first to N^th bits, the selection signal includes first to (N−1)^th bits, and N is set to a natural number of 2 or more, generate the (N−1)^th bit of the selection signal which has a first logic level, when the N^th bit of the first input signal is different from the N^th bit of the second input signal, and generate the (N−1)^th bit of the selection signal which has a second logic level, when the N^th bit of the first input signal is the same as the N^th bit of the second input signal.

4. The semiconductor device according to claim 3, wherein the comparison signal generation circuit is configured to output the N^th bit of the first input signal as the comparison signal when the (N−1)^th bit of the selection signal has the first logic level.

5. The semiconductor device according to claim 3, wherein the comparison signal generation circuit is configured to output a signal obtained by inverting and buffering the N^th bit of the second input signal as the comparison signal when the (N−1)^th bit of the selection signal has the first logic level.

6. The semiconductor device according to claim 3, wherein the comparison signal generation circuit is configured to generate the comparison signal by comparing the first bit of the first input signal and the first bit of the second input signal when all of the first to (N−1)^th bits of the selection signal are set to the second logic level.

7. The semiconductor device according to claim 3, wherein the comparison signal generation circuit is configured to generate the comparison signal which has the second logic level, when all of the first to (N−1)^th bits of the selection signal are set to the second logic level, the first bit of the first input signal has the second logic level, and the first bit of the second input signal has the first logic level.

8. The semiconductor device according to claim 3, wherein the comparison signal generation circuit is configured to generate the comparison signal which has the first logic level, when all of the first to (N−1)^th bits of the selection signal are set to the second logic level and the first bit of the first input signal has the first logic level.

9. The semiconductor device according to claim 1, wherein the comparison signal comprises one bit.

10. A semiconductor device comprising:
a selection signal generation circuit configured to generate an (N−1)^th bit of a selection signal which has a first logic level, when an N^th bit of a first input signal is different from an N^th bit of a second input signal; and
a comparison signal generation circuit configured to receive first and second input signals and configured to output the N^th bit of the first input signal as a comparison signal when the (N−1)^th bit of the selection signal has the first logic level, wherein N is a natural number of 2 or more, the comparison signal generation circuit comprising a plurality of serially-connected code selection circuits, each code selection circuit having: first and second input signal ports, a selection signal port and an output port from which the comparison signal is output responsive to the value of a signal provided to the selection signal port;

wherein the comparison signal has a first logic level when the first input signal is set to be equal to or smaller than the second input signal, wherein the comparison signal has a second logic level when the first input signal is set to be larger than the second input signal, and wherein each of the first input signal and the second input signal comprises more bits than the comparison signal.

11. The semiconductor device according to claim 10, wherein the selection signal generation circuit is configured to generate the (N−1)^th bit of the selection signal which has a second logic level, when the N^th bit of the first input signal is the same as the N^th bit of the second input signal.

12. The semiconductor device according to claim 11, wherein the comparison signal generation circuit is configured to generate the comparison signal by comparing a first bit of the first input signal and a first bit of the second input signal when all bits included in the selection signal are set to the second logic level.

13. The semiconductor device according to claim 11, wherein the comparison signal generation circuit is configured to generate the comparison signal which has the second logic level, when all the bits included in the selection signal are set to the second logic level, the first bit of the first input signal has the second logic level, and the first bit of the second input signal has the first logic level.

14. The semiconductor device according to claim 11, wherein the comparison signal generation circuit is configured to generate the comparison signal which has the first logic level, when all the bits included in the selection signal are set to the second logic level and the first bit of the first input signal has the first logic level.

15. A semiconductor device comprising:
a selection signal generation circuit configured to generate an (N−1)^th bit of a selection signal which has a first logic level, when an N^th bit of a first input signal is different from an N^th bit of a second input signal; and
a comparison signal generation circuit configured to receive first and second input signals and which is configured to output a comparison signal by inverting and buffering the N^th bit of the second input signal when the (N−1)^th bit of the selection signal has the first logic level, wherein N is a natural number of 2 or more, the comparison signal generation circuit comprising a plurality of serially-connected code selection circuits, each code selection circuit having: first and second input signal ports, a selection signal port and an output port from which the comparison signal is output responsive to the value of a signal provided to the selection signal port;

wherein the comparison signal has a first logic level when the first input signal is set to be equal to or smaller than the second input signal, wherein the comparison signal has a second logic level when the first input signal is set to be larger than the second input signal, and wherein each of the first input signal and the second input signal comprises more bits than the comparison signal.

16. The semiconductor device according to claim 15, wherein the selection signal generation circuit is configured to generate the (N−1)^th bit of the selection signal which has a second logic level, when the N^th bit of the first input signal is the same as the N^th bit of the second input signal.

17. The semiconductor device according to claim 16, wherein the comparison signal generation circuit is configured to generate the comparison signal by comparing a first bit of the first input signal and a first bit of the second input signal when all bits included in the selection signal are set to the second logic level.

18. The semiconductor device according to claim 16, wherein the comparison signal generation circuit is configured to generate the comparison signal which has the second logic level, when all the bits included in the selection signal are set to the second logic level, the first bit of the first input signal has the second logic level, and the first bit of the second input signal has the first logic level.

19. The semiconductor device according to claim 16, wherein the comparison signal generation circuit is configured to generate the comparison signal which has the first logic level, when all the bits included in the selection signal are set to the second logic level and the first bit of the first input signal has the first logic level.

* * * * *